(12) United States Patent
Schmidt et al.

(10) Patent No.: US 8,520,396 B2
(45) Date of Patent: Aug. 27, 2013

(54) METHOD FOR PRODUCING AN ELECTRONIC MODULE

(75) Inventors: Manuela Schmidt, Esslingen (DE);
Axel Franke, Ditzingen (DE); Sven Zinober, Friolzheim (DE)

(73) Assignee: Robert Bosch GmbH, Stuttgart (DE)

( * ) Notice: Subject to any disclaimer, the term of this patent is extended or adjusted under 35 U.S.C. 154(b) by 330 days.

(21) Appl. No.: 12/660,066

(22) Filed: Feb. 19, 2010

(65) Prior Publication Data
US 2010/0232119 A1 Sep. 16, 2010

(30) Foreign Application Priority Data
Mar. 11, 2009 (DE) .................. 10 2009 001 461

(51) Int. Cl.
*H05K 7/00* (2006.01)

(52) U.S. Cl.
USPC ........................................ 361/746

(58) Field of Classification Search
USPC ......... 361/746, 712, 760, 764, 768; 257/678, 257/686, 703, 778; 174/255, 256, 258, 260
See application file for complete search history.

(56) References Cited

U.S. PATENT DOCUMENTS

| 5,239,448 | A  | * | 8/1993 | Perkins et al. ................. 361/764 |
| 6,406,939 | B1 |   | 6/2002 | Lin |
| 7,042,077 | B2 | * | 5/2006 | Walk et al. .................... 257/686 |

* cited by examiner

*Primary Examiner* — Jeremy Norris
*Assistant Examiner* — Tremesha S Willis
(74) *Attorney, Agent, or Firm* — Kenyon & Kenyon LLP

(57) ABSTRACT

A method for producing an electronic module, in that at least one first microelectronic component is provided and is electrically connected to a second microelectronic component by a first flip-chip method step; at least one dielectric component is provided which has at least one printed circuit trace, and at least one printed circuit trace of the dielectric component is electrically connected to the second microelectronic component; and the second microelectronic component is electrically connected by a second flip-chip method step to a printed circuit board by way of the printed circuit trace(s) of the dielectric component, in order to avoid vias through a microelectronic component; the invention also relates to a corresponding electronic module.

21 Claims, 2 Drawing Sheets

METHOD FOR PRODUCING AN ELECTRONIC MODULE

BACKGROUND OF THE INVENTION

1. Field of the Invention

The present invention relates to a method for producing an electronic module, as well as an electronic module.

2. Description of Related Art

A multitude of packaging concepts exist for bringing together different sized semiconductor chips, such as microelectromechanical system chips (MEMS chips) and application-specific integrated circuit chips (ASIC chips). They are usually based on ceramic, premold or mold packages, in which the chips are placed side by side or one upon the other, and are connected to each other and to the external contacts by wire bonds.

Microelectromechanical system chips may be mounted on application-specific integrated circuit chips using flip-chip technology. In so doing, the contacting of the microelectromechanical system chip is usually accomplished by way of through-silicon vias (TSV) through the application-specific integrated circuit chip. However, producing vias through silicon chips is costly and painstaking and includes numerous process steps such as etching, deposition and patterning of insulating layers and metallization.

SUMMARY OF THE INVENTION

The subject matter of the present invention is a method for producing an electronic module, in that
- at least one first microelectronic component is provided and is electrically connected to a second microelectronic component by a first flip-chip method step,
- at least one dielectric component is provided that has at least one printed circuit trace, and at least one printed circuit trace of the dielectric component is electrically connected to the second microelectronic component, and
- the second microelectronic component is electrically connected by way of the printed circuit trace(s) of the dielectric component to a printed circuit board by a second flip-chip method step.

Within the context of the present invention, the term "flip-chip method" is understood in particular to be a method in which a microelectronic component is mounted directly, that is, for example, without a lead wire, on a substrate, e.g., another microelectronic component or a printed circuit board by way of one or more contact points, particularly bumps.

Advantageously, in this way it is possible to avoid vias through a microelectronic component, e.g., a silicon chip, particularly for the contacting of another component. Therefore, within the ambit of the present invention, microelectronic components may be mounted as first and/or second microelectronic components which have no vias. The method of the present invention thus expediently permits cost-effective production of electronic modules, particularly chip-size packages.

DETAILED DESCRIPTION OF THE INVENTION

Figure 1:
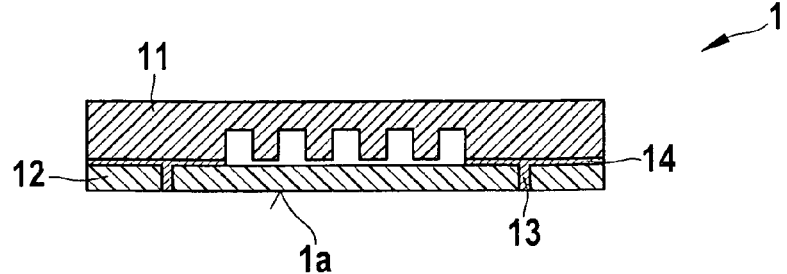
FIG. 1 shows a schematic cross-section through a first microelectronic component.

Within the scope of the present invention, the first and/or the second microelectronic component may be a microchip. In particular, the first and/or the second microelectronic component may in each case have a contacting side. For example, as customary in the flip-chip method, the first and/or the second microelectronic component may in each instance have only one contacting side. Accordingly, the electronic module may have a double flip-chip construction, e.g., an (IC-) flip-chip/(MEMS-) flip-chip hybrid construction.

Within the scope of the present invention, the first microelectronic component may be electrically connected to the printed circuit board by way of the second microelectronic component and by way of one of the printed circuit traces of the dielectric component.

Within the context of one specific embodiment of the method according to the present invention, the contacting side of the first microelectronic component is electrically connected to the contacting side of the second microelectronic component by a-first flip-chip method step. In this context, the dielectric component may likewise be electrically connected to the contacting side of the second microelectronic component.

The second microelectronic component may have or be furnished with at least one printed circuit trace configured on its contacting side. In this context, the contacting side of the first microelectronic component may be electrically connected to the printed circuit board by way of the printed circuit trace(s) on the contacting side of the second microelectronic component and by way of one of the printed circuit traces of the dielectric component.

Within the framework of one preferred specific embodiment of the method according to the present invention, the second microelectronic component is larger than the first microelectronic component. In particular, within the context of this specific embodiment, the second microelectronic component may have larger main surfaces than the first microelectronic component. The "main surfaces" of a component in this context are understood, in particular, to be the two largest areas of a component opposite one another.

Within the scope of a further specific embodiment of the method according to the present invention, the first and the second microelectronic components are microelectronic components of a different type.

Within the context of another preferred specific embodiment of the method according to the present invention, the first microelectronic component is a microelectromechanical system or an integrated circuit, e.g., an application-specific standard product (ASSP) or an application-specific integrated circuit (ASIC) or an application-specific instruction-set processor (ASIP), particularly an application-specific integrated circuit (ASIC). In particular, the first microelectronic component may be a microelectromechanical system. In this context, "microelectromechanical systems" are understood in particular to be both microelectromechanical systems (MEMS) and smaller electromechanical systems such as nanoelectromechanical systems (NEMS). For instance, the first microelectronic component may be a microelectromechanical system having a thin-film cover. The thin-film cover of the first microelectronic component may have vias for the contacting of the first microelectronic component.

Within the scope of a further preferred specific embodiment of the method according to the present invention, the second microelectronic component is a microelectromechanical system or an integrated circuit, e.g., an application-specific standard product (ASSP) or an application-specific integrated circuit (ASIC) or an application-specific instruction-set processor (ASIP), particularly an application-specific integrated circuit (ASIC). In particular, the second microelectronic component may be an integrated circuit, e.g., an application-specific standard product (ASSP) or an application-specific integrated circuit (ASIC) or an application-specific instruction-set processor (ASIP), particularly an application-specific integrated circuit (ASIC).

Within the framework of another preferred specific embodiment of the method according to the present invention, two or more first microelectronic components are electrically connected, particularly by way of the respective contacting sides, by the first flip-chip method step to a second microelectronic component, especially to the contacting side of the second microelectronic component. In this context, the first microelectronic components may be the same or different relative to each other. In this way, different functions may be integrated into the electronic module of the present invention.

Within the scope of another preferred specific embodiment of the method according to the present invention, two or more dielectric components, each having at least one printed circuit trace, are electrically connected to the second microelectronic component, particularly to the contacting side of the second microelectronic component.

Preferably, the first microelectronic component(s) and the dielectric component(s) are aligned prior to the electrical connection. The electrical connection may be accomplished within the course of the first and second flip-chip method steps by way of contacting points, particularly soldering points, what are referred to as solder bumps.

The dielectric component(s) may be connected, especially mechanically and/or electrically, to the second microelectronic component(s) by a joining process, e.g., diffusion soldering or SLID bonding (SLID: solid liquid interdiffusion, a bonding method in which two metals form an alloy by heating and contact pressure), direct bonding (a thermal bonding process in which a silicon-polymer bond is produced by plasma activation and subsequent pressure welding) and/or adhesive bonding.

Within the framework of a further preferred specific embodiment of the method according to the present invention, the second microelectronic component, particularly after the electrical connection to the first microelectronic components and the dielectric components, is divided into two or more groupings, each including at least one first microelectronic component, at least one dielectric component and at least one second microelectronic component segment. Advantageously, this makes it possible to produce a plurality of electronic modules in an easy manner.

Preferably, within the scope of the method according to the present invention, the first microelectronic component, the second microelectronic component and the printed circuit board are sandwiched. In particular, the first microelectronic component may be positioned between the second microelectronic component and the printed circuit board. At the same time, the dielectric component may likewise be disposed between the second microelectronic component and the printed circuit board.

Within the context of an especially preferred specific embodiment of the method according to the present invention, the dielectric component is in the form of a frame. Within the meaning of the present invention, a "component in the form of a frame" may be understood, for example, as a component which has a form that essentially resembles the form of a picture frame or a door frame, particularly a picture frame. Within the scope of one refinement of this specific embodiment, the dielectric component is in the form of a frame covered on one side by a covering layer. In this context, understood by the term of a "frame covered on one side by a layer" is, in particular, a frame where the area defined by the frame is covered on one side by a covering layer. An embodiment of the dielectric component in the form of a frame covered on one side by a covering layer has the advantage that the frame and the covering layer protect the first microelectronic component and at least a part of the second microelectronic component from mechanical stress, e.g., due to particulates, and/or from corrosive media.

Preferably, the first microelectronic component(s) is/are disposed within the frame-shaped dielectric component. The space for the first microelectronic component(s) and the dielectric component may thereby be optimized to advantage. To the extent that the second microelectronic component and the printed circuit board have a larger main surface than the first microelectronic component or the totality of the first microelectronic components, the frame-shaped dielectric component may even require no additional space.

Advantageously, the overall size of the electronic module may thereby be kept small. The covering layer of the frame may have a spring structure, particularly to compensate for different thermal expansion coefficients of the first electronic components.

Within the framework of a further preferred specific embodiment of the method according to the present invention, the dielectric component(s) in each case has/have at least one printed circuit trace in the form of a via. The printed circuit trace(s) in the form of a via may be produced by introducing a through-going hollow space into the dielectric component, e.g., using a micro-injection molding process, a hot stamping process, a punching process or a laser process, and by filling the through-going hollow space or coating the wall of the through-going hollow space with a conductive material. The coating of the wall of the through-going hollow space has the advantage that the amount of material, the coating/metallization duration and the effects of different expansion coefficients may be reduced. For instance, the conductive material may be a conductive polymer or nickel, copper, silver, gold or an alloy thereof. The filling or coating with the conductive material, especially the metallization, may be accomplished chemically, galvanically or by sputtering, particularly physical vapor deposition (PVD). When working with whole-area methods, in which the entire dielectric component is metallized, regions which are metal-free and therefore insulating may be produced again by subsequent patterning.

Within the scope of another preferred specific embodiment of the method according to the present invention, in each case the dielectric component(s) has/have at least one printed circuit trace on one surface, particularly an outer frame surface, or the dielectric component(s) is/are in each case provided with at least one printed circuit trace on one surface, especially an outer frame surface. The printed circuit trace(s) may be formed from a conductive polymer or from nickel, copper, silver, gold or an alloy thereof. The printed circuit trace(s) may likewise be formed chemically, galvanically or by sputtering, particularly physical vapor deposition (PVD); in the case of whole-area methods, in which the entire dielectric component is metallized, regions which are metal-free and therefore insulating may be produced again by subsequent patterning.

Within the context of a further preferred specific embodiment of the method according to the present invention, in each case the dielectric component(s) is/are formed from a polymer or a polyblend. In particular, the dielectric component(s) may be formed from a polymer or a polyblend which is dimensionally stable at soldering temperatures. For example, the dielectric component(s) may be formed from a thermoplastic, particularly a high-temperature-resistant thermoplastic, selected, for instance, from the group made up of liquid crystal polymers (LCP), polyetherketones, especially polyether ether ketones (PEEK), polysulphones, polyphenylene sulfide (PPS), polyimides, polyamides or mixtures thereof, a duromer, selected, for example, from the group made up of polyepoxides, aminoplastics, phenolic resins, polyester resins or mixtures thereof.

A further subject matter of the present invention is an electronic module, including:
- at least one first microelectronic component,
- at least one second microelectronic component,
- at least one dielectric component which has at least one printed circuit trace, and
- a printed circuit board, the first microelectronic component being electrically connected to the second microelectronic component, and the second microelectronic component being electrically connected to the printed circuit board by way of the printed circuit trace(s) of the dielectric component.

The electronic module of the present invention has the advantage that vias through one microelectronic component, e.g., a silicon chip, particularly for contacting the other component, may be avoided. Therefore, within the scope of the present invention, microelectronic components may be used as first and/or second microelectronic components which have no vias.

Within the context of the present invention, the first microelectronic component may be electrically connected to the printed circuit board by way of the second microelectronic component and by way of one of the printed circuit traces of the dielectric component.

Within the scope of the present invention, the first and/or second microelectronic component may be a microchip. In particular, the first and/or second microelectronic component may in each case have a contacting side. For example, as customary in the flip-chip method, the first and/or the second microelectronic component may in each instance have only one contacting side. Accordingly, the electronic module may have a double flip-chip construction, e.g., an (IC-)flip-chip/(MEMS-) flip-chip hybrid construction.

Within the framework of one specific embodiment of the electronic module according to the present invention, the contacting side of the first microelectronic component is electrically connected to the contacting side of the second microelectronic component. In this context, the dielectric component may likewise be electrically connected to the contacting side of the second microelectronic component.

The second microelectronic component may have at least one printed circuit trace configured on its contacting side. For example, the contacting side of the first microelectronic component may be electrically connected to the printed circuit board by way of the printed circuit trace(s) on the contacting side of the second microelectronic component and by way of one of the printed circuit traces of the dielectric component.

Within the context of one preferred specific embodiment of the electronic module according to the present invention, the second microelectronic component is larger than the first microelectronic component. In particular, within the context of this specific embodiment, the second microelectronic component may have larger main surfaces than the first microelectronic component.

Within the scope of a further specific embodiment of the electronic module according to the present invention, the first and the second microelectronic components are microelectronic components of a different type.

Within the framework of another preferred specific embodiment of the electronic module according to the present invention, the first microelectronic component is a microelectromechanical system or an integrated circuit, e.g., an application-specific standard product (ASSP) or an application-specific integrated circuit (ASIC) or an application-specific instruction-set processor (ASIP), particularly an application-specific integrated circuit (ASIC). In particular, the first microelectronic component may be a microelectromechanical system. In this context, "microelectromechanical systems" are understood in particular to be both microelectromechanical systems (MEMS) and smaller electromechanical systems such as nanoelectromechanical systems (NEMS). For instance, the first microelectronic component may be a microelectromechanical system having a thin-film cover. The thin-film cover of the first microelectronic component may have vias for the contacting of the first microelectronic component.

Within the scope of a further preferred specific embodiment of the electronic module according to the present invention, the second microelectronic component is a microelectromechanical system or an integrated circuit, e.g., an application-specific standard product (ASSP) or an application-specific integrated circuit (ASIC) or an application-specific instruction-set processor (ASIP), particularly an application-specific integrated circuit (ASIC). In particular, the second microelectronic component may be an integrated circuit, e.g., an application-specific standard product (ASSP) or an application-specific integrated circuit (ASIC) or an application-specific instruction-set processor (ASIP), particularly an application-specific integrated circuit (ASIC).

Within the context of a further preferred specific embodiment of the electronic module according to the present invention, the electronic module has two or more first microelectronic components. In this context, the first microelectronic components may be the same or different relative to each other.

Preferably, the first microelectronic component, the second microelectronic component and the printed circuit board are sandwiched. In so doing, the first microelectronic component may be situated between the second microelectronic component and the printed circuit board. The dielectric component may likewise be disposed between the second microelectronic component and the printed circuit board.

Within the scope of a further preferred specific embodiment of the electronic module according to the present invention, the dielectric component is in the form of a frame.

Within the scope of one refinement of this specific embodiment, the dielectric component is in the form of a frame covered on one side by a covering layer. Preferably, the first microelectronic component(s) is/are disposed within the frame-shaped dielectric component.

Within the context of another preferred specific embodiment of the electronic module according to the present invention, the covering layer of the frame has a spring structure, particularly to compensate for different thermal expansion coefficients of the first electronic components.

Within the scope of a further preferred specific embodiment of the electronic module according to the present invention, the dielectric component has at least one printed circuit trace in the form of a via.

Within the framework of a further preferred specific embodiment of the electronic module according to the present invention, the dielectric component(s) in each case has/have at least one printed circuit trace configured on the surface, particularly an outer frame surface, of the dielectric component.

Within the context of the present invention, the printed circuit trace(s) may be formed from a conductive polymer or from nickel, copper, silver, gold or an alloy thereof.

Within the scope of another preferred specific embodiment of the electronic module according to the present invention, the dielectric component(s) is/are in each instance formed from a polymer or a polyblend. In particular, the dielectric component(s) may in each case be formed from a polymer or a polyblend which is dimensionally stable at soldering temperatures. For example, the dielectric component(s) may in each case be formed from a thermoplastic, particularly a high-temperature-resistant thermoplastic, selected, for instance, from the group made up of liquid crystal polymers (LCP), polyetherketones, especially polyether ether ketones (PEEK), polysulphones, polyphenylene sulfide (PPS), polyimides, polyamides or mixtures thereof, a duromer, selected, for example, from the group made up of polyepoxides, aminoplastics, phenolic resins, polyester resins or mixtures thereof.

FIG. 1 shows a specific embodiment of a first microelectronic component 1. First microelectronic component 1 is a microelectronic system 11, having a thin-film cover 12. To contact microelectronic system 11 from contacting side 1a, thin-film cover 12 has vias 13, which are electrically connected to microelectronic system 11 by way of contact points 14, referred to as bonding pads.

Figure 2A:
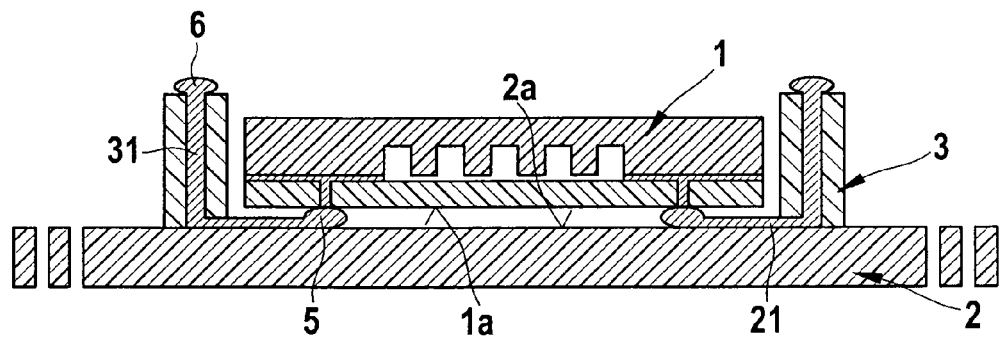
FIG. 2a shows a schematic cross-section through a grouping made up of a first microelectronic component, a frame-shaped dielectric component and a second microelectronic component after the first flip-chip method step.

FIG. 2a shows a schematic cross-section through a grouping 1, 2, 3 made up of a first microelectronic component 1, a frame-shaped dielectric component 3 and a second microelectronic component 2 after the first flip-chip method step.

FIG. 2a illustrates that contacting side 1a of first microelectronic component 1 shown in FIG. 1 was electrically connected by the first flip-chip method step to contacting side 2a of second microelectronic component 2, e.g., an application-specific integrated circuit (ASIC). FIG. 2 further shows that frame-shaped dielectric component 3 has printed circuit traces 31 in the form of vias, which were electrically connected to contacting side 2a of second microelectronic component 2. Within the ambit of the present invention, the electrical connection of dielectric component 3 to second microelectronic component 2 may be carried out both simultaneously with the first flip-chip method step, and prior to or after the first flip-chip method step.

FIG. 2a shows that in the first flip-chip method step, first microelectronic component 1 was electrically connected to second microelectronic component 2 by way of contact points 5, especially soldering points, referred to as solder bumps. In particular, in so doing, first microelectronic component 1 was electrically connected to printed circuit traces 21, which second microelectronic component 2 has on contacting side 2a. Printed circuit traces 21 configured on contacting side 2a of second microelectronic component 2 were in turn electrically connected to printed circuit traces 31 of dielectric component 3. Depending on the type of first 1 and second 2 microelectronic component, they may be electrically connected both with separate and with common printed circuit traces 21, 31.

FIG. 2a further shows that first microelectronic component 1 was disposed within frame-shaped dielectric component 3. Within the context of the specific embodiments shown in the Figures, second microelectronic component 2 has larger main surfaces 2a than first microelectronic component 1, 1a. This has the advantage that no additional space is needed by frame-shaped dielectric component 3.

The segmented representation of second microelectronic component 2 in the Figures symbolizes that, within the course of the method according to the present invention, it is possible to electrically connect two or more first microelectronic components 1 and two or more dielectric components 3, respectively, to second microelectronic component 2, and to subsequently divide second microelectronic component 2 into two or more groupings 1, 2, 3.

Figure 2B:
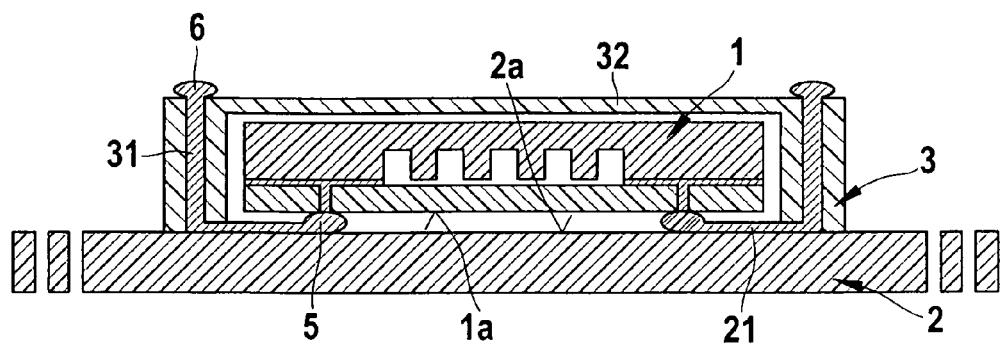
FIG. 2b shows a schematic cross-section through a grouping made up of a first microelectronic component, a dielectric component in the form of a frame covered on one side by a covering layer, and a second microelectronic component after the first flip-chip method step.

FIG. 2b differs from FIG. 2a in that dielectric component 3 is in the form of a frame covered on one side by a covering layer 32.

Figure 3A:
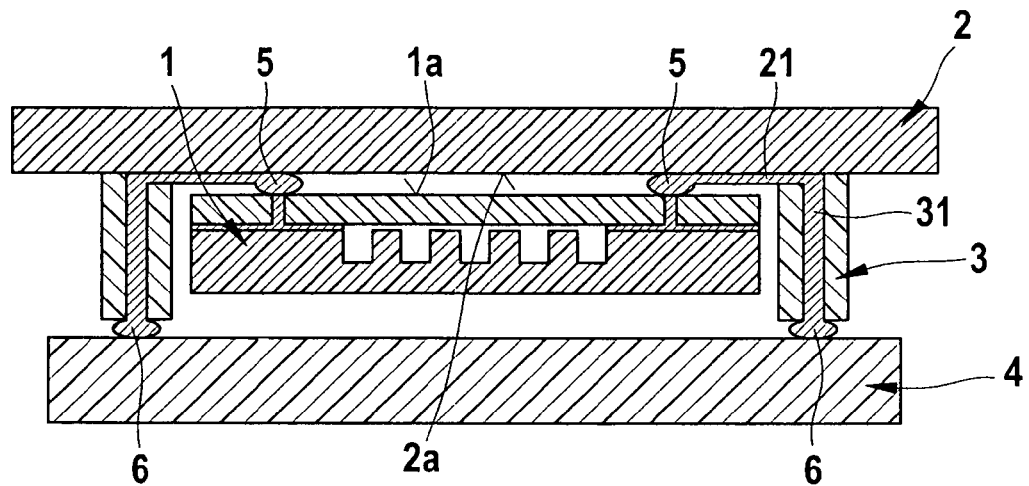
FIG. 3a shows a schematic cross-section through a grouping made up of a first microelectronic component, a frame-shaped dielectric component, a second microelectronic component and a printed circuit board after the second flip-chip method step.

FIG. 3a shows a schematic cross-section through a grouping made up of first microelectronic component 1, frame-shaped dielectric component 3, second microelectronic component 2 and a printed circuit board 4 after the second flip-chip method step. FIG. 3a illustrates that grouping 1, 2, 3 shown in FIG. 2a was electrically connected to a printed circuit board 4 by the second flip-chip method step. In particular, grouping 1, 2, 3 was electrically connected by the second flip-chip method step to printed circuit board 4 by way of printed circuit traces 31 of dielectric component 3, and contact points 6, particularly soldering points, so-called solder bumps.

FIG. 3a further shows that, in resulting electronic module 1, 2, 3, 4 of the present invention, first microelectronic component 1, second microelectronic component 2, frame-shaped dielectric component 3 and printed circuit board 4 are sandwiched, first microelectronic component 1 and frame-shaped dielectric component 3 being positioned between second microelectronic component 2 and printed circuit board 4, and first microelectronic component 1 being situated within the frame of dielectric component 3.

Figure 3B:
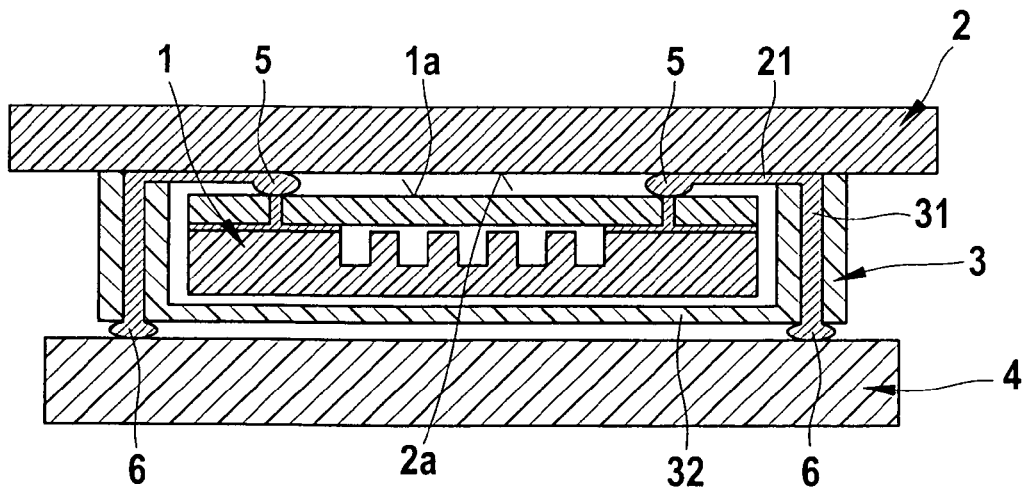
FIG. 3b shows a schematic cross-section through a grouping made up of a first microelectronic component, a dielectric component in the form of a frame covered on one side by a covering layer, a second microelectronic component and a printed circuit board after the second flip-chip method step.

FIG. 3b differs from FIG. 3a in that dielectric component 3 is in the form of a frame covered on one side by a covering layer 32.

What is claimed is:

1. A method for producing an electronic module, comprising:
   mounting at least one first microelectronic component directly onto a second microelectronic component below the first microelectronic component, by way of at least one contact point that electrically connects the at least one first microelectronic component to at least one printed circuit trace on a contacting side of the second microelectronic component;
   providing at least one dielectric component extending from the contacting side of the second microelectronic component to a height above that of the at least one first microelectronic component;

electrically connecting at least one printed circuit trace of the at least one dielectric component to the at least one printed circuit trace on the contacting side of the second microelectronic component; and mounting the at least one dielectric component to a printed circuit board by way of at least one contact point that electrically connects the at least one printed circuit trace of the at least one dielectric component to the printed circuit board.

2. The method as recited in claim 1, wherein: at least two first microelectronic components are electrically connected to the second microelectronic component or at least two dielectric components, each having at least one printed circuit trace, are electrically connected to the second microelectronic component.

3. The method as recited in claim 2, further comprising:
after the electrical connection of the first microelectronic and dielectric components to the second microelectronic component, dividing the second microelectronic component into at least two groupings, each of which includes at least one first microelectronic component, at least one dielectric component and at least one second microelectronic component segment.

4. The method as recited in claim 1, wherein the second microelectronic component is larger than the first microelectronic component.

5. The method as recited in claim 1, wherein the dielectric component is in the form of a frame or in the form of a frame covered on one side by a covering layer.

6. The method as recited in claim 5, wherein the first microelectronic component is disposed within the frame-shaped dielectric component.

7. The method as recited in claim 1, wherein: the dielectric component has at least one printed circuit trace in the form of a via; or at least one surface of the dielectric component has at least one printed circuit trace.

8. The method as recited in claim 1, wherein:
the first microelectronic component is a microelectromechanical system and the second microelectronic component is an integrated circuit, or
the first microelectronic component is an integrated circuit, and the second microelectronic component is a microelectromechanical system.

9. The method as recited in claim 8, wherein the integrated circuit is an application-specific standard product or an application-specific integrated circuit or an application-specific instruction-set processor.

10. An electronic module, comprising:
at least one first microelectronic component;
a second microelectronic component below the at least one first microelectronic component and on which the at least one first microelectronic component is directly mounted, by way of at least one contact point that electrically connects the at least one first microelectronic component to at least one printed circuit trace on a contacting side of the second microelectronic component;
at least one dielectric component extending from the contacting side of the second microelectronic component to a height above that of the at least one first microelectronic component and which has at least one printed circuit trace electrically connected to the at least one printed circuit trace on the contacting side of the second microelectronic component; and
a printed circuit board on which the at least one dielectric component is mounted, and to which the at least one printed circuit trace of the at least one dielectric component is electrically connected, by way of at least one contact point.

11. The electronic module as recited in claim 10, wherein the second microelectronic component is larger than the first microelectronic component.

12. The electronic module as recited in claim 10, wherein the first microelectronic component, the second microelectronic component and the printed circuit board are sandwiched, the first microelectronic component being positioned between the second microelectronic component and the printed circuit board.

13. The electronic module as recited in claim 10, wherein the dielectric component is in the form of a frame or in the form of a frame covered on one side by a covering layer.

14. The electronic module as recited in claim 13, wherein the first microelectronic component is disposed within the frame-shaped dielectric component.

15. The electronic module as recited in claim 10, wherein the electronic module has at least two first microelectronic components.

16. The electronic module as recited in claim 13, wherein the dielectric component is in the form of a frame covered on one side by a covering layer, and wherein the covering layer of the frame has a spring structure to compensate for different thermal expansion coefficients of the first electronic components.

17. The electronic module as recited in claim 10, wherein the dielectric component has at least one printed circuit trace in the form of a via or at least one printed circuit trace configured on the surface of the dielectric component.

18. The electronic module as recited in claim 10, wherein the dielectric component is formed from a polymer or a polyblend.

19. The electronic module as recited in claim 10, wherein:
the first microelectronic component is a microelectromechanical system and the second microelectronic component is an integrated circuit, or
the first microelectronic component is an integrated circuit, and the second microelectronic component is a microelectromechanical system.

20. The electronic module as recited in claim 19, wherein the integrated circuit is an application-specific standard product or an application-specific integrated circuit or an application-specific instruction-set processor.

21. The method of claim 1, wherein the at least one first microelectronic component is enclosed by the second microelectronic component, the at least one dielectric component, and the printed circuit board.

* * * * *